United States Patent
Ando et al.

[11] Patent Number: 5,931,337
[45] Date of Patent: Aug. 3, 1999

[54] SEMICONDUCTOR ACCOMMODATING DEVICES AND METHOD FOR INSERTING AND TAKING OUT SEMICONDUCTOR DEVICES

[75] Inventors: Yukio Ando; Motohiro Yamashita; Kimiko Miura; Ayako Ito, all of Kawasaki, Japan

[73] Assignee: Fujitsu Limited, Kawasaki, Japan

[21] Appl. No.: 08/949,434

[22] Filed: Oct. 14, 1997

[30] Foreign Application Priority Data

Oct. 14, 1996  [JP]  Japan ................................. 8-270653

[51] Int. Cl.⁶ .................................................. B65G 59/00

[52] U.S. Cl. ................................................. 221/1; 221/74

[58] Field of Search .................. 221/69, 71, 74, 221/25, 26, 27, 89–208, 255, 256

[56] References Cited

U.S. PATENT DOCUMENTS 4,494,902  1/1985  Kuppens et al. ............................ 221/74
5,259,911  11/1993  Ohnishi et al. ............................ 221/71

*Primary Examiner*—Kenneth Noland
*Attorney, Agent, or Firm*—Armstrong, Westerman, Hattori, McLeland & Naughton

[57] ABSTRACT

A semiconductor accommodating device using an embossed tape and a method for inserting and taking out semiconductor devices, without using a top cover tape that had hitherto been used. The semiconductor accommodating device comprises a reel and an embossed tape wound on the reel. The embossed tape has a bottom wall for placing a semiconductor device thereon, two side walls upwardly extending from both side edges of the boom wall, and top walls having an opening. The side walls are formed such that the semiconductor device inserted through the opening is held by the side walls with the semiconductor device placed on the bottom wall.

9 Claims, 7 Drawing Sheets

SEMICONDUCTOR ACCOMMODATING DEVICES AND METHOD FOR INSERTING AND TAKING OUT SEMICONDUCTOR DEVICES

BACKGROUND OF THE INVENTION

1. Field of the Invention

The present invention relates to a semiconductor accommodating device using an embossed tape and to a method for inserting and taking out semiconductor devices.

2. Description of the Related Art

Semiconductor devices (ICs and LSIs) are often accommodated in a semiconductor accommodating device that uses an embossed tape to transport them from a semiconductor device manufacturer to the users. FIGS. 12 and 13 are views illustrating a semiconductor accommodating device using a conventional embossed tape. The semiconductor accommodating device 1 comprises a reel 2, an embossed tape 3 wound on the reel 2, and a top cover tape 4. The embossed tape 3 has pockets 6 for accommodating semiconductor devices 5. After the semiconductor devices 5 are inserted in the pockets 6, the embossed tape 3 is sealed with the top cover tape 4 by the application of heat or pressure.

The pocket 6 is larger than the semiconductor device 5, and the side walls of the pocket 6 are wider toward the top thereof so that the semiconductor device 5 can be easily inserted into the pocket 6. The top cover tape 4 works to hold the semiconductor device 5 in the pocket 6. In order to seal the embossed tape 3 with the top cover tape 4 by the application of heat or pressure, however, a sealing step is required, and the user must peel the top cover tape 4 off the embossed tape 3, resulting in an increase in the number of working steps. This increases the cost for the material of the top cover tape 4 and the number of working steps.

Furthermore, an embossed tape 3 having heat resistance cannot be obtained, because the embossed tape 3 loses heat resistance when it is sealed with the top cover tape even if the embossed tape 3 is made from a resin having heat resistance. Furthermore, the top cover tape 4 easily breaks when the semiconductor devices 5 are taken out, so the mounting device is subject to jamming. Moreover, time is wasted for re-winding the top cover tape 4 after it is used.

Also, the embossed tape 3 after it is used includes a trace of the sealed and peeled-off top cover tape 4, so the embossed tape 3 cannot be used again. The embossed tape 3 after use must be shredded and discarded. Therefore, the embossed tape 3 and the top cover tape 4 must be treated as industrial waste and environmental contamination is increased.

SUMMARY OF THE INVENTION

The object of the present invention is to provide a semiconductor accommodating device in which conventional top cover tapes can be omitted, and a method for inserting and taking out semiconductor devices.

A semiconductor accommodating device according to the present invention comprises a reel and an embossed tape wound on the reel, said embossed tape having a bottom wall for placing a semiconductor device thereon, two side walls extending upwardly from both side edges of said bottom wall, and top walls having an opening formed therebetween, the side walls being formed such that the semiconductor device inserted through said opening is held by said side walls with the semiconductor device is placed on the bottom wall.

According to this arrangement, the semiconductor device is inserted in the embossed tape, and the embossed tape itself works to hold the semiconductor device. Therefore, it is not necessary to use a top cover tape, which is used to seal the embossed tape in the prior art. Since there is no need to use the top cover tape, the embossed tape can be formed by using a resin having heat resistance property or by using a biodegradable resin. The semiconductor accommodating device including the embossed tape, can also be repeatedly used.

Preferably, the distance between the two side walls at a position where the two side walls are joined to the bottom wall is larger than a distance between the two side walls at a position above the bottom wall. In this case, preferably, the distance between the two side walls at a position above the bottom wall is smaller than the size of a semiconductor device that is to be accommodated, and the semiconductor device is inserted through the opening in the top walls with the two side walls resiliently expanded, and, when the semiconductor device is placed on the bottom wall, the two side walls are brought back to the initial position to hold the semiconductor device therebetween.

Preferably, the bottom wall further includes protrusions that protrude at a predetermined pitch, and a pocket for accommodating the semiconductor device is defined by the two side walls and the two neighboring protrusions. In this case, the protrusions partly extend between the two side walls so that they will not come into contact with the two side walls, or the protrusions continuously extend between the two side walls so as to come into contact with the two side walls. The height of the protrusions is lower than the height of the side walls and, preferably, the height of the protrusions is lower than one-half the height of the side walls.

A method of inserting semiconductor devices according to the present invention comprises the steps of expanding two side walls of the embossed tape by using at least one tool, inserting a semiconductor device through an opening formed in top walls of the embossed tape in the state in which the two side walls are expanded, and allowing the two side walls to return to the initial position so that the semiconductor device is held by the two side walls. Therefore, this method does not use the top cover tape, which had hitherto been used.

A method for taking out semiconductor devices according to the present invention comprises the steps of: expanding two side walls of the embossed tape by using at least one tool, taking a semiconductor device placed on the bottom wall of the embossed tape out through an opening in the top walls of the embossed tape, and allowing the two side walls to return to the initial position. Therefore, this method does not use the top cover tape which had hitherto been used.

According to the present invention, the semiconductor accommodating device can be used repeatedly. That is, according to a method of inserting and taking out semiconductor devices of the present invention, the two side walls of the embossed tape are expanded by at least one tool, a semiconductor device is inserted through an opening in the top walls of the embossed tape in a state where the two side walls are expanded so that the semiconductor device is placed on the bottom wall of the embossed tape, and the two side walls are returned to the initial position so that the semiconductor device is held by the two side walls in a first station; the semiconductor accommodating device accommodating the semiconductor devices is then transported from the first station to a second station; the two side walls of the embossed tape are expanded by at least one tool at the second station, the semiconductor device placed on the bottom wall of the embossed tape is taken out through the opening in the top walls of the embossed tape, and the two side walls are returned to the initial position; the embossed tape that is empty is then transported to the second station from the first station; and new semiconductor devices are inserted in the transported semiconductor accommodating device that includes the embossed tape.

According to the above-mentioned method, the at least one tool comprises a tool that comes into contact with the two side walls simultaneously, or the at least one tool comprises a plurality of tools that come into contact with the two side walls simultaneously. Preferably, the semiconductor device is inserted by using a suction head.

BRIEF DESCRIPTION OF THE DRAWINGS

The present invention will become more apparatus from the following description of the preferred embodiments, with reference to the accompanying drawing, in which.

DESCRIPTION OF THE PREFERRED EMBODIMENTS

Figure 1:
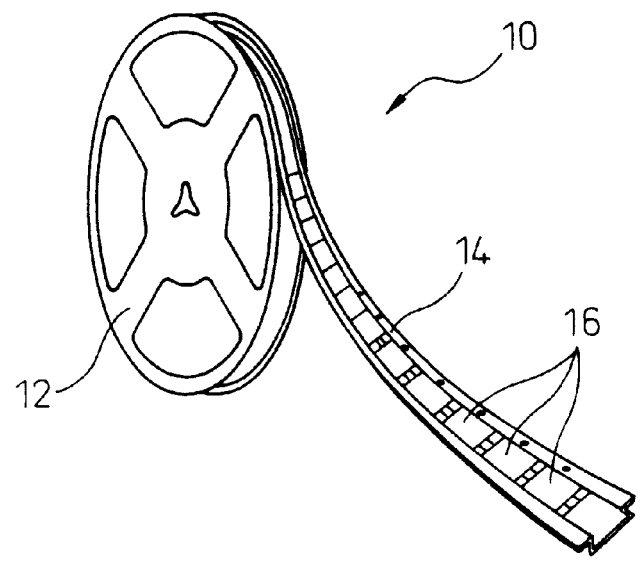
FIG. 1 is a perspective view of a semiconductor accommodating device according to the embodiment of the present invention.

FIG. 1 illustrates a semiconductor accommodating device 10 according to the embodiment of the present invention. The semiconductor accommodating device 10 includes a reel 12 and an embossed tape 14 wound on the reel 12. Semiconductor devices 16 are accommodated in the embossed tape 14. The embossed tape 14 is made of PVC, PS, PET, PC, PPE, PP or a biodegradable resin, and contains a carbon powder or is coated with carbon or with an antistatic agent on the surfaces thereof in order to guard against static electricity. When there is no need to prevent static electricity, the carbon powder need not be included. Resins such as PC, PPE, PP, etc. have heat resistance property.

Figure 2:
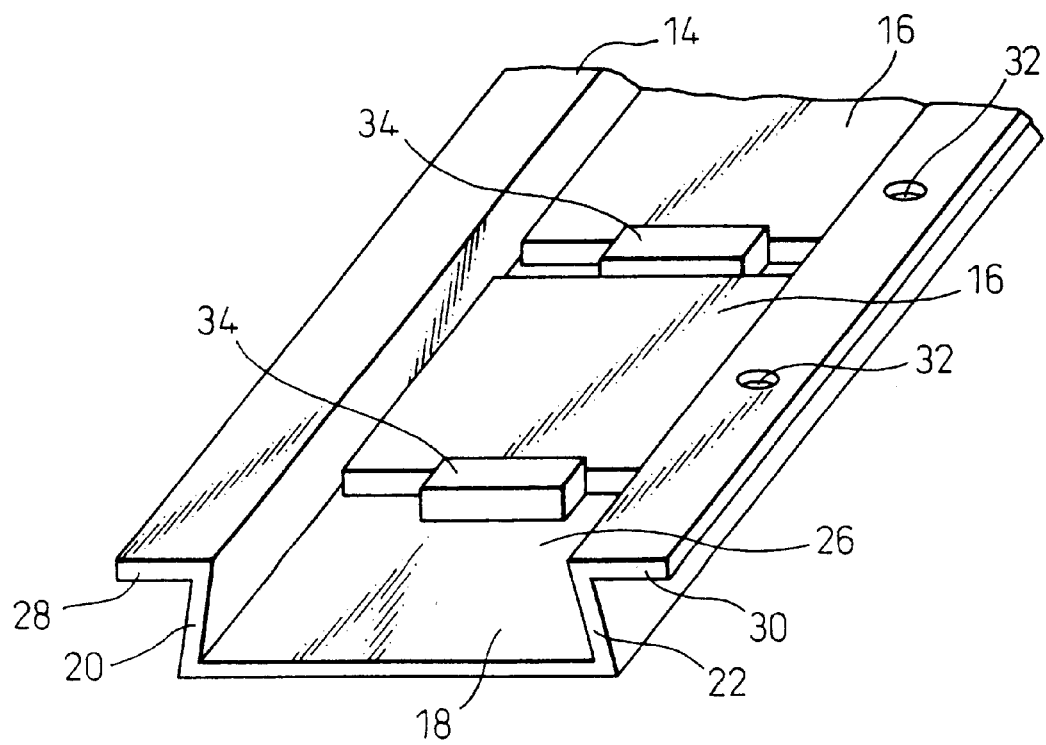
FIG. 2 is a perspective view illustrating the embossed tape of FIG. 1 on an enlarged scale.
Figure 3:
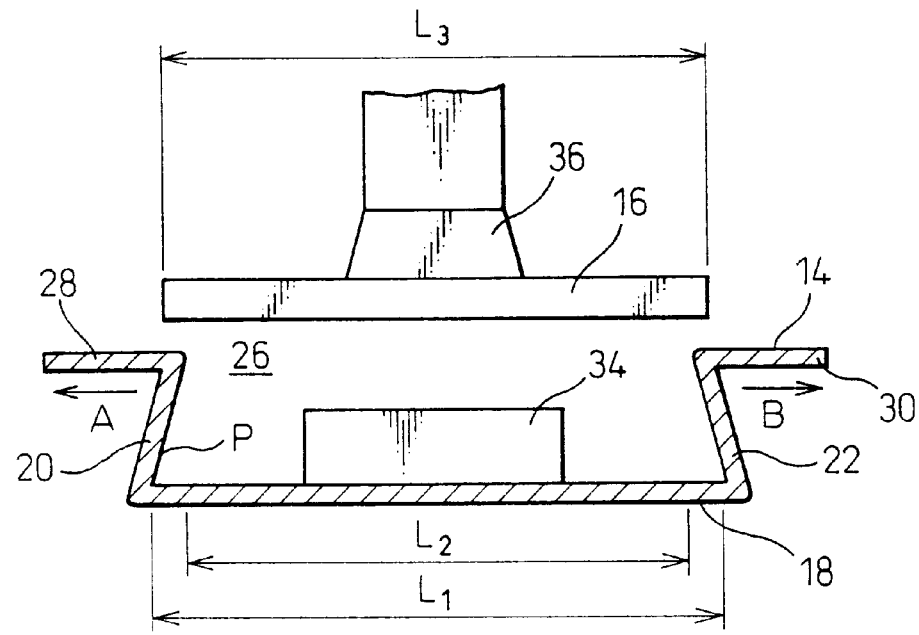
FIG. 3 is a cross-sectional view of the embossed tape of FIG. 2.

FIGS. 2 and 3 illustrate the embossed tape 14 in detail. The embossed tape 14 has a bottom wall 18 on which the semiconductor device 16 will be placed, two side walls 20 and 22 extending upwardly from both side edges of the bottom wall 18, and top walls 28 and 30 forming an opening 26 therebetween. The semiconductor device 16 is inserted in the embossed tape 14 from the upper side of the opening 26 in the top walls, and is placed on the bottom wall 18.

One top wall 30 has holes 32 for feeding the embossed tape 14 by using a pin that is not shown. Protrusions 34 protrude on the bottom wall 18 at a predetermined constant pitch, and a pocket for accommodating the semiconductor device 16 is defined between the two side walls 20, 22 and the neighboring two protrusions 34. In FIGS. 2 and 3, the protrusions 34 partly extend between the two side walls 20 and 22 so that they do not come into contact with the two side walls 20 and 22.

The bottom wall 18 is substantially flat, and the two side walls 20 and 22 are tapered relative to the bottom wall 18 in such a manner that distance between the two side walls becomes narrower from the bottom wall 18 to the top walls. The top walls 28 and 30 are outwardly bent from the top portions of the side walls 20 and 22, and extend in parallel with the bottom wall 18.

Therefore, the distance L1 between the two side walls 28 and 30 at a position where the two side walls 20 and 22 are joined to the bottom wall 18, is larger than the distance between the two side walls 20, 22 at a position (e.g., denoted by P in FIG. 3) above the bottom wall 18. The distance between the two side walls 20 and 22 at the top portions of the two side walls 20 and 22, is denoted by L2.

The distance between the two side walls 20 and 22 at a position above the bottom wall 18 is smaller than the size L3 of the semiconductor device 16 that is to be accommodated. When the semiconductor device 16 is to be inserted in the embossed tape 14 by using a suction head 36, the two side walls 20 and 22 are resiliently expanded as indicated by arrows A and B in FIG. 3. That is, the semiconductor device 16 is inserted through the opening 26 in the top walls with the two side walls 20 and 22 resiliently expanded.

The two side walls 20 and 22 are allowed to return to the initial position when the semiconductor device 16 is placed on the bottom wall 18. As a result, the two side walls 20 and 22 cover the semiconductor device 16 and the latter is thus held in the embossed tape 14 by the two side walls 20 and 22 so that the semiconductor device 16 does not escape from the embossed tape 14. Preferably, the two side walls 20 and 22 rest against and come into contact with the semiconductor device 16 to resiliently hold it.

Figure 4:
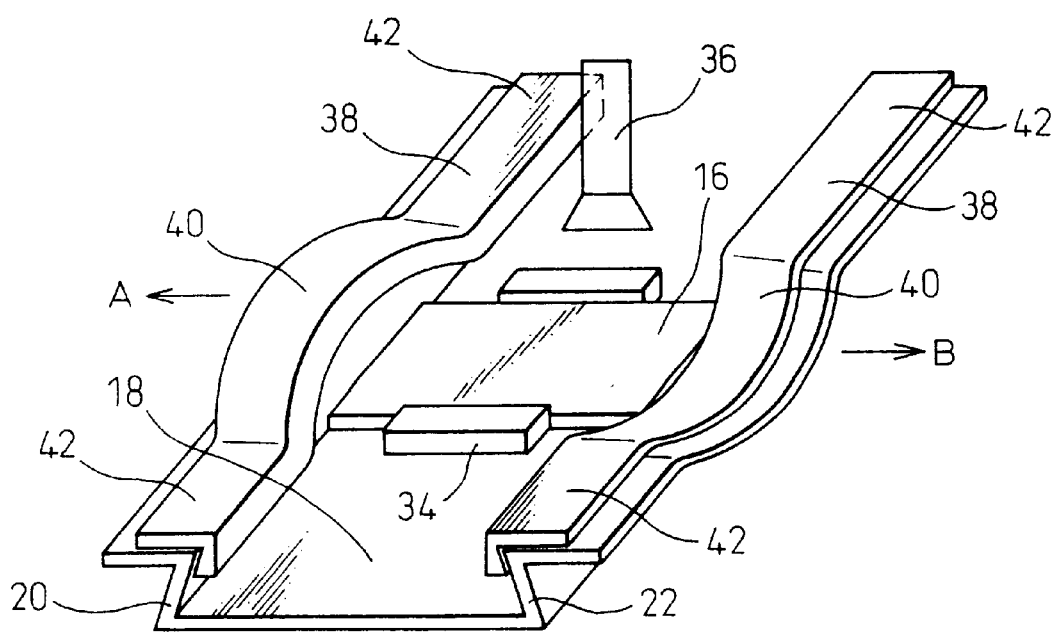
FIG. 4 is a perspective view illustrating how to insert a semiconductor device in the embossed tape, using tools.

FIG. 4 illustrates how to insert the semiconductor device 16 in the embossed tape 14 by using two tools 38. Each tool 38 is an angle-like elongated member applied to the upper surface and inner surface of each of the side walls 20, 22, and has an outwardly arcuately curved portion 40 in the middle section thereof and straight portions 42 on either sides of the portion 40. The portions of the side walls 20 and 22 of the embossed tape 14 that engage with the straight portions 42 are not substantially deformed, but the portions of the side walls of the embossed tape 14 engaging with the curved portions 40 are outwardly deformed and expanded as indicated by the arrows A and B.

The tools 38 are arranged at fixed positions, and the embossed tape 14 is conveyed in a predetermined direction. The suction head 36 supporting the semiconductor device 16 by suction operates in synchronism with the embossed tape 14, and inserts the semiconductor device 16 in the expanded pocket of the embossed tape 14. As the embossed tape 14 is advanced by one pitch, the side walls 20 and 22 of the pocket in which the semiconductor device 16 is inserted return resiliently to the initial position, and the side walls 20 and 22 in the next pocket are expanded and a next semiconductor device 16 is inserted.

FIG. 4 also illustrates how to take out the embossed tape 14 from the semiconductor device 16 by using two tools 38. The features of the tools 38 are as described earlier. It is presumed that the semiconductor device 16 has been contained in the embossed tape 14. Even in this case, the curved portions 40 of the tools 38 are outwardly expanded as indicated by the arrows A and B. Here, the suction head 36 is lowered to support the semiconductor device 16 by suction, and is raised to take out the semiconductor device 16. After the semiconductor device 16 is taken out, the embossed tape 14 is advanced by one pitch, and the side walls 20 and 22 resiliently return to the initial position.

Figure 5:
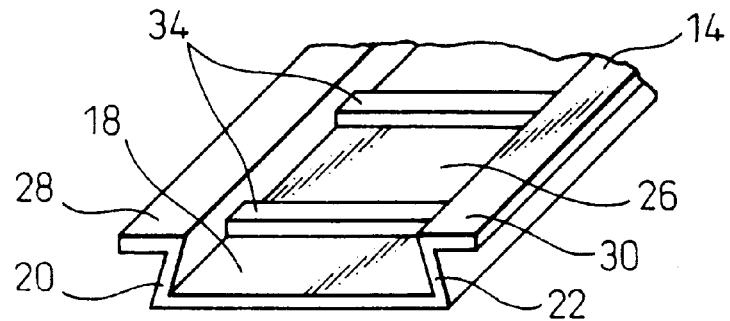
FIG. 5 is a perspective view of a modified example of the embossed tape.
Figure 6:
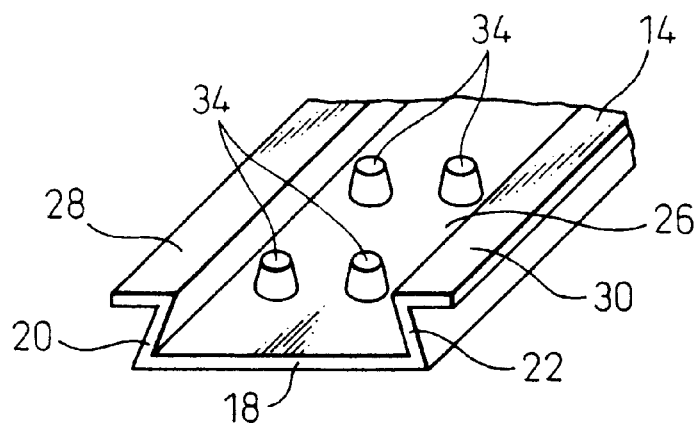
FIG. 6 is a perspective view of a further modified example of the embossed tape.
Figure 7:
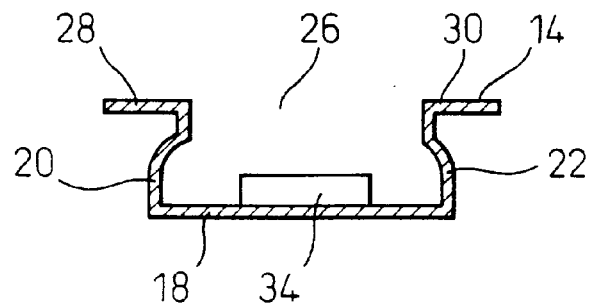
FIG. 7 is a cross-sectional view of a further modified example of the embossed tape.

FIGS. 5 to 7 illustrate modified examples of the embossed tape 14.

In FIG. 5, the embossed tape 14 has a bottom wall 18, two side walls 20 and 22, and top walls 28 and 30 with an opening 26 in the same manner as that of FIG. 2. In this example, the protrusions 34 continuously extend between the two side walls 20 and 22 in a manner to be joined to the two side walls 20 and 22. The height of the protrusions 34 is smaller than the height of the side walls 20 and 22. In particular, the height of the protrusions is smaller than one-half the height of the side walls 20 and 22. The height of the protrusions 34 can be applied to other embossed tapes 14.

In FIG. 6, the embossed tape 14 has the same structure as chat of the above-mentioned example, but the protrusions 34 extend partly between the two side walls 20 and 22, and two small protrusions are arranged in the transverse direction of the embossed tape 14.

In FIG. 7, the embossed tape 14 has a bottom wall 18, two side walls 20 and 22, and top walls 28 and 30 with an opening 26. In this example, the side walls 20 and 22 are not of a flat shape but are curved to become narrower toward the upper side. In this case too, the semiconductor device 16 is inserted in a state where the side walls 20 and 22 are expanded. The side walls 20 and 22 that have returned to the initial position hold the semiconductor device 16.

Figure 8:
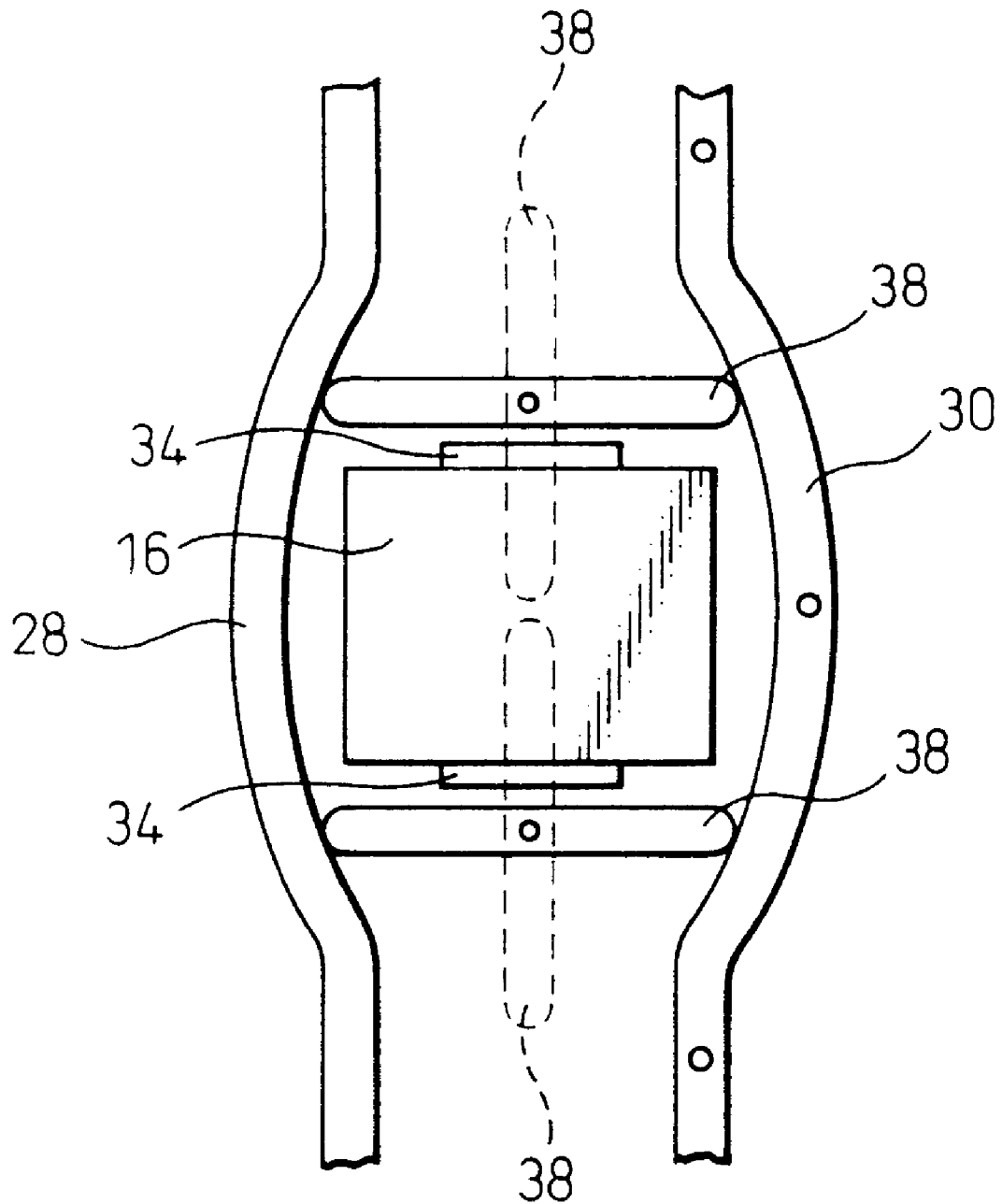
FIG. 8 is a view schematically illustrating a modified example of the tool for expanding the side walls.
Figure 9:
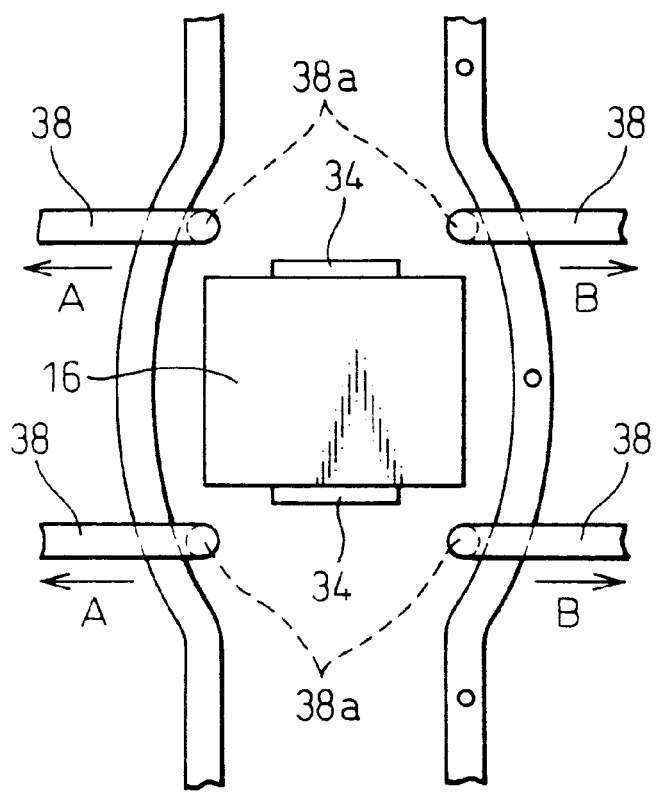
FIG. 9 is a view schematically illustrating a modified example of the tool for expanding the side walls.
Figure 10:
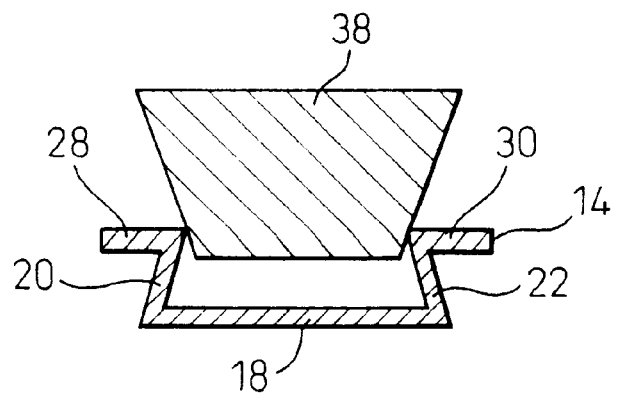
FIG. 10 is a cross-sectional view schematically illustrating a modified example of the tool for expanding the side walls.

FIGS. 8 to 10 illustrate modified examples of the tools 38 for expanding the side walls 20 and 22.

In FIG. 8, the two tools 38 are arranged inside the embossed tape 14. The two tools 38 have a length longer than the distance between the two side walls 20 and 22, and are allowed to rotate between the position indicated by solid lines and the position indicated by broken lines. To expand the side walls 20 and 22, the two tools 38 extend in the transverse direction of the embossed tape 14 as indicated by solid lines. After the semiconductor device 16 is inserted, the two tools 38 are extended in the lengthwise direction of the embossed tape 14 as indicated by broken lines. The side walls 20 and 22 that have returned to the initial position hold the semiconductor device 16.

In FIG. 9, the four tools 38 are arranged on the upper portions of the embossed tape 14. The tools 38 have pawls 38a downwardly extending in the embossed tape 14. Upon moving the tools 38 in the directions of arrows A and B, the side walls 20 and 22 can be expanded.

In FIG. 10, the tool 38 has a trapezoidal shape in cross section. Upon lowering the tool 38, the side walls 20 and 22 can be expanded.

Figure 11:
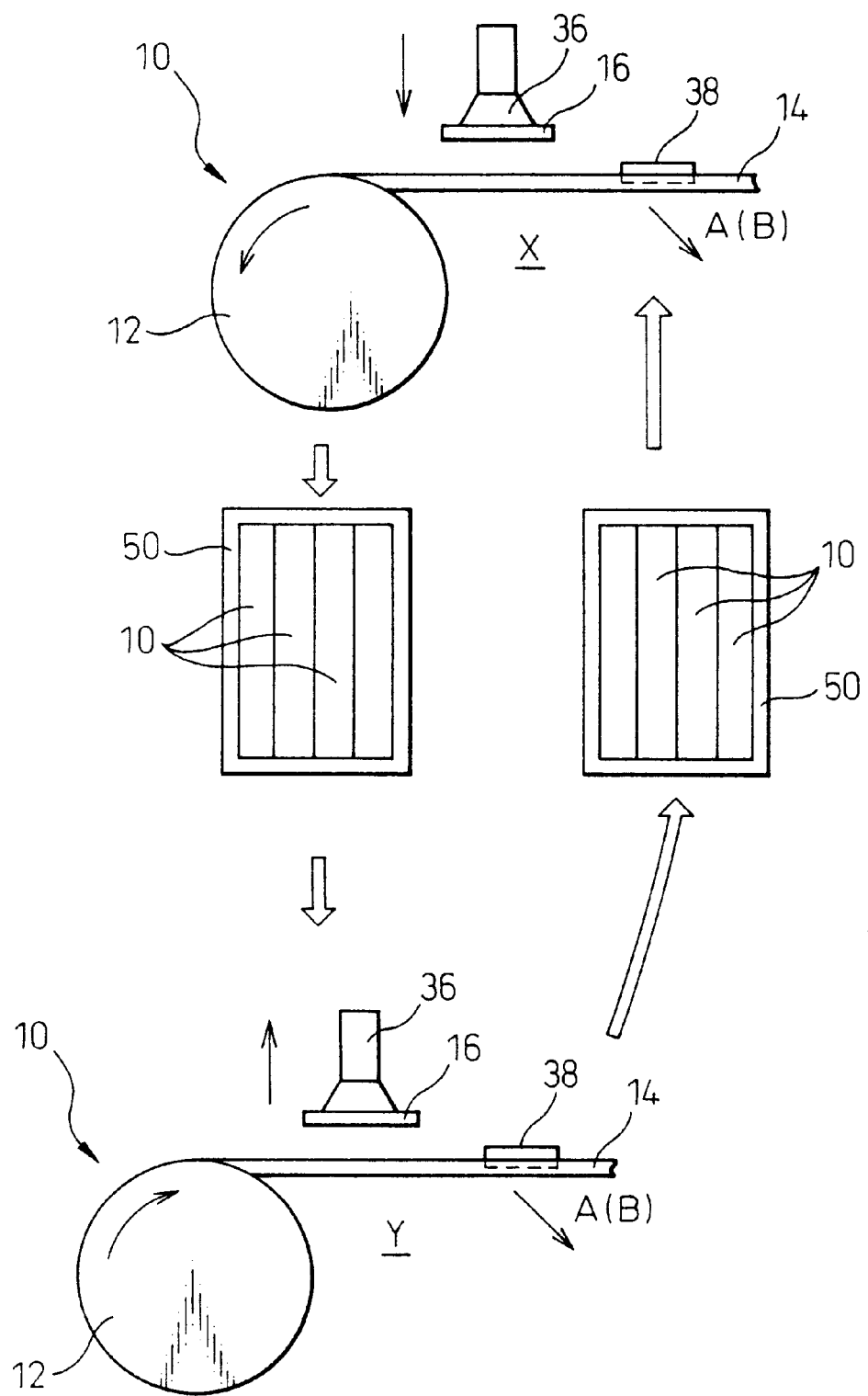
FIG. 11 is a view illustrating the system for repeatedly using the semiconductor accommodating device.
Figure 12:
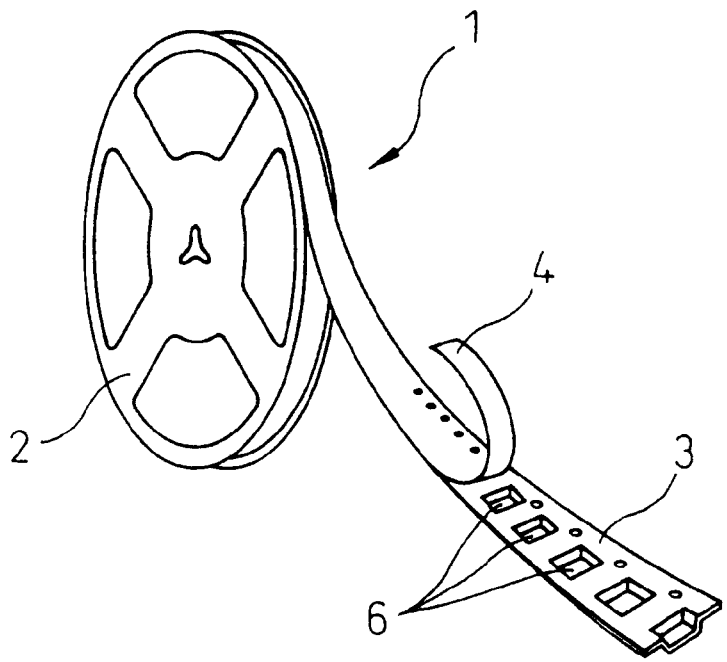
FIG. 12 is a view illustrating a conventional semiconductor accommodating device.
Figure 13:
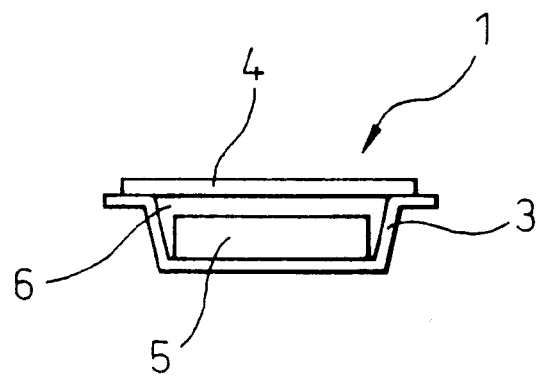
FIG. 13 is a schematic view of the embossed tape of FIG. 12.

FIG. 11 illustrates a system for repeatedly using the semiconductor accommodating device 10 comprising a reel 12 and an embossed tape 14 wound on the reel 12. In this system, the semiconductor device 15 is inserted in the semiconductor accommodating device 10 and is taken out from the semiconductor accommodating device 10. As for the details of the members, reference should be made to the above-mentioned embodiments.

FIG. 11 illustrates a station X and a station Y. The station X corresponds to a place where the semiconductor devices 16 are manufactured, and the station Y corresponds to a place where the semiconductor devices 16 are used.

In the station X, the semiconductor devices 16 are inserted in the semiconductor accommodating device 10. That is, the two side walls 20 and 22 of the embossed tape 14 are expanded by at least one tool 38, the semiconductor device 16 is inserted by the suction head 36 through the opening 26 in the top walls 28 and 30 of the embossed tape 14 in a state where the two side walls 20 and 22 are being expanded, and the semiconductor device 16 is placed on the bottom wall 18 of the embossed tape 14. Thereafter, the two side walls 20 and 22 are allowed to return to the initial position so that the semiconductor device 16 is held by the two side walls 20 and 22.

Then, the semiconductor accommodating device 10 accommodating the semiconductor devices 16 is transported from the station X to the station Y. For example, the semiconductor accommodating device 10 is transported, using a corrugated cardboard box 50.

At the station Y, the semiconductor devices 16 are taken out from the semiconductor accommodating device 10. That is, the two side walls 20 and 22 of the embossed tape 14 are expanded by at least one tool 38, the semiconductor device 16 placed on the bottom wall 14 of the embossed tape 14 is taken out through the opening 26 in the top walls 28, 30 of the embossed tape 14, and the two side walls 20 and 22 are allowed to return to the initial position. The semiconductor device 16 thus taken out is mounted on an electronic device that may include a printed wiring board.

Thereafter, the empty embossed tape 14 is transported from the station Y to the station X. According to the present invention, the embossed tape need not be sealed with the top cover tape that had hitherto been used, and is mostly undamaged. Therefore, the embossed tape 14 that has been used is wound on the reel 12 and can be repeatedly reused. The used embossed tape 14 can be wound on the reel 12 either in the station Y or in the station X. FIG. 11 illustrates the case where the used embossed tape 14 is wound on the reel 12 in the station Y and the semiconductor accommodating device 10 comprising the reel 12 and the embossed tape 14 is transported using the corrugated cardboard box 50. When the used embossed tape 14 is to be wound on the reel 12 in the station X, the embossed tape 14 is transported in the corrugated cardboard box.

In the station X, therefore, new semiconductor devices 16 are inserted in the semiconductor accommodating device 10 that is returned. The semiconductor accommodating device 10 accommodating the new semiconductor devices 16 is transported to the station Y again and the semiconductor device 16 is used.

According to the present invention, as explained in greater detail, the embossed tape need not be sealed with the top cover tape that had hitherto been used, it is possible to save cost of the top cover tape. Furthermore, the embossed tape is not so easily damaged and can be reused.

We claim:

1. A semiconductor accommodating device comprising a reel and an embossed tape wound on said reel, said embossed tape having a bottom wall for placing a semiconductor device thereon, two side walls extending upwardly from both side edges of said bottom wall, and top walls having an opening formed therebetween, said side walls being formed such that the semiconductor device inserted through said opening is held by said side walls with said semiconductor device placed on said bottom wall.

2. A semiconductor accommodating device according to claim 1, wherein a distance between said two side walls at a position where said two side walls are joined to said bottom wall is larger than a distance between said two side walls at a position above said bottom wall.

3. A semiconductor accommodating device according to claim 2, wherein the distance between said two side walls at a position above said bottom wall is smaller than a size of a semiconductor device that is to be accommodated, said semiconductor device is inserted through the opening in said top walls with said two side walls resiliently expanded, and, when said semiconductor device is placed on said bottom wall, said two side walls are brought back to the initial position to hold the semiconductor device therebetween.

4. A semiconductor accommodating device according to claim 1, wherein said bottom wall further includes protrusions that protrude at a predetermined pitch, and a pocket for accommodating the semiconductor device is defined by said two side walls and said two neighboring protrusions.

5. A method for inserting semiconductor devices in a semiconductor accommodating device comprising a reel and an embossed tape wound on said reel, said method comprising the steps of: expanding two side walls of said embossed tape by at least one tool; inserting a semiconductor device through an opening formed in top walls of said embossed tape in a state where the two side walls are expanded to place the semiconductor device on a bottom wall of said embossed tape; and allowing said two side walls to return to the initial position so that the semiconductor device is held by said two side walls.

6. A method for inserting semiconductor devices according to claim 5, wherein a distance between said two side walls at a position above said bottom wall is smaller than a size of a semiconductor device that is to be accommodated, the two side walls of said embossed tape is resiliently expanded by said at least one tool, and, after said semiconductor device is inserted, said two side walls are allowed to resiliently return to the initial position so that said semiconductor device is held by said two side walls.

7. A method for taking out semiconductor devices from a semiconductor accommodating device comprising a reel and an embossed tape wound on said reel, said method comprising the steps of: expanding two side walls of said embossed tape by at least one tool, taking a semiconductor device placed on the bottom wall of said embossed tape out through an opening in the top walls of said embossed tape, and allowing said two side walls to return to the initial position.

8. A method for taking out semiconductor devices according to claim 7, wherein a distance between said two side walls at a position above said bottom wall is smaller than a size of a semiconductor device that is to be accommodated, the semiconductor device is resiliently held by said two side walls, the two side walls of said embossed tape are resiliently expanded by said at least one tool, and, after the semiconductor device is inserted, said two side walls are allowed to resiliently return back to the initial position.

9. A method for inserting semiconductor devices in a semiconductor accommodating device comprising a reel and an embossed tape wound on said reel, and for taking out semiconductor devices from said semiconductor accommodating device, said method comprising the steps of:

in a first station, expanding two side walls of said embossed tape by at least one tool; inserting a semiconductor device through an opening in top walls of said embossed tape in a state where said two side walls are expanded so that said semiconductor device is placed on a bottom wall of said embossed tape; and allowing said two side walls to return to the initial position so that the semiconductor device is held by said two side walls;

transporting said semiconductor accommodating device accommodating said semiconductor devices from the first station to a second station;

in the second station, expanding the two side walls of said embossed tape by at least one tool; taking a semiconductor device placed on the bottom wall of said embossed tape out through the opening in the top wall of said embossed tape; and allowing said two side walls to return to the initial position;

transporting said embossed tape that is empty from said second station to said first station; and inserting new semiconductor devices in said transported semiconductor accommodating device that includes said embossed tape.

* * * * *